United States Patent [19]

Sato et al.

[11] Patent Number: 5,154,873
[45] Date of Patent: Oct. 13, 1992

[54] METHOD AND APPARATUS FOR MOUNTING SLICE BASE ON WAFER OF SEMICONDUCTOR

[75] Inventors: Tsutomu Sato; Yasushi Yoshimura, both of Niigata, Japan

[73] Assignee: Naoetsu Electronics Company, Niigata, Japan

[21] Appl. No.: 590,806

[22] Filed: Oct. 1, 1990

[30] Foreign Application Priority Data

Dec. 11, 1989 [JP] Japan .................. 1-322222

[51] Int. Cl.$^5$ .................. H01L 21/304; H01L 21/78; B29C 39/10
[52] U.S. Cl. .................. 264/279; 264/297.8; 425/123; 425/125; 425/127
[58] Field of Search .................. 264/297.8, 252, 279; 425/110, 123, 124, 125, 127; 51/73 R, 5 B, 5 C; 125/13.01, 13.02, 16.01; 437/226; 29/25.01 B; 156/254

[56] References Cited

U.S. PATENT DOCUMENTS 4,261,781 4/1981 Edmonds et al. .................. 156/254

FOREIGN PATENT DOCUMENTS 64-19729 1/1989 Japan .
1-293613 11/1989 Japan .

OTHER PUBLICATIONS

Partial English translation of Japanese Publication No. 1-293613.
Partial English translation of Japanese Publication No. 64-19729.

Primary Examiner—Michael W. Ball
Assistant Examiner—Michele K. Yoder
Attorney, Agent, or Firm—Sandler, Greenblum & Bernstein

[57] ABSTRACT

It is known that it is advantageous in semiconductor wafer production to re-slice a semiconductor wafer having impurity diffusion layers on both sides which are processed or doped in advance of the re-slicing process. In the re-slicing process, a thin slice base is mounted on the periphery of a semiconductor wafer prior to the re-slicing process for protecting the periphery of the wafer from chipping off damage during the re-slicing process by an ID saw or the like. The present invention provides several examples of methods and apparatus for mounting a slice base prepared in advance on the periphery of a semiconductor wafer by utilizing the method and apparatus of the present invention. In addition, another method and apparatus for simultaneously molding and mounting a molded type slice base by using a thermosetting type resin on the periphery of the semiconductor, whereby the re-slicing process of a semiconductor wafer is extremely improved in production and labor cost.

7 Claims, 11 Drawing Sheets

METHOD AND APPARATUS FOR MOUNTING SLICE BASE ON WAFER OF SEMICONDUCTOR

BACKGROUND OF THE INVENTION

1. Field of the Invention

This invention relates to a method and apparatus for mounting a piece of thin slice-base on a semiconductor wafer, which was processed in advance of being sliced from a crude material, such as silicon ingot or the like, and further processed to form impurity diffusion layers on both sides in advance, of slicing, and more particularly, for mounting the slice-base chip on the peripheral edge of the semiconductor wafer for protecting the lower end of the semiconductor wafer from any chipping off during the re-slicing process from a sheet of the semiconductor wafer into two sheets for the purpose of manufacturing a substrate for a discrete component, which is used for a transister, diode, discrete component or the like.

2. Description of the Prior Art

The applicant of the present invention previously suggested, in his Japanese patent provisional application No. Hei 1-293613, and also from other prior art, such as the Japanese patent provisional application No. Sho 64-19729 or U.S. Pat. No. 4,261,781, that the idea of manufacturing substrates for discrete components by re-slicing a sheet of a semiconductor wafer, which is formed with an impurity diffusion layer on both sides in advance, into two sheets from substantially the center portion of core thickness of the sheet in order to obtain two sheets of wafers, having an impurity diffusion layer on one side and a plane surface on the other side; however, there is no suggestion to mount any thin slice bases on the periphery of the semiconductor wafer upon the completion of re-slicing process in the above prior art.

In addition, the applicant of the present invention also suggested, in his Japanese patent application No. Hei 1-137037, a technology for re-slicing a semiconductor wafer having impurity diffusion layers on both sides of the wafer processed in advance before the re-slicing process in order to improve the productivity of producing the semiconductor wafer.

In the aforementioned suggestions by the applicant, as a suggested means of mounting the slice base on the peripheral edge of the wafer, for example, the slice base is mounted with one wafer by using an adhesive on the peripheral edge of the wafer, which is aligned in advance on a wafer magazine.

Figure 1:
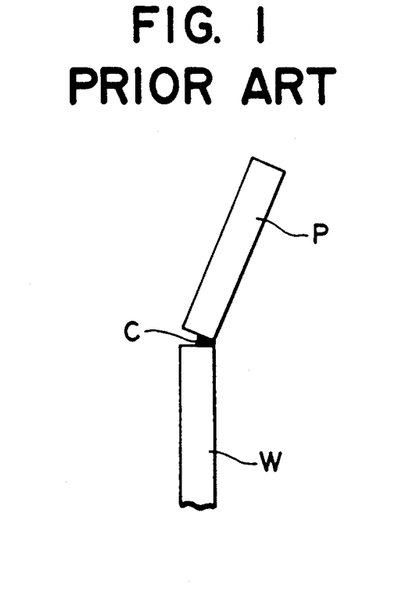
FIG. 1 and FIG. 2 are side views for showing the disadvantages of conventional art relating to fixing a slice base on a semiconductor wafer.
Figure 2:
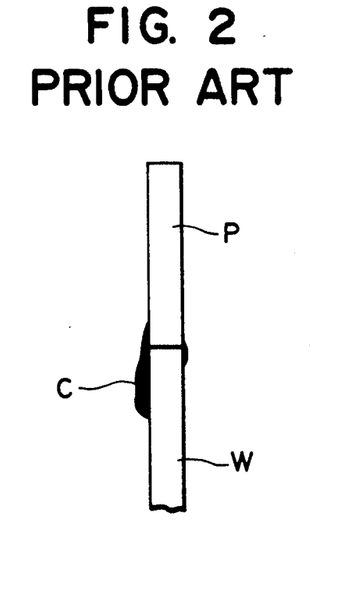

This conventional means, however, has the following disadvantages as shown in FIG. 1: a slice base(P) tends to incline in advance from a wafer(W) until an adhesive(C) has been solidified, wherein a shortage of adhesive strength and errors in the accuracy of measurements between them are caused, or as shown in FIG. 2, an adhesive falls in drops downwardly along a wafer surface wherein it causes an irregularity on the surface of the wafer to spoil the workabilities of subsequent processes.

SUMMARY OF THE INVENTION

In accordance with the present invention, a method and apparatus are provided for mounting a slice base capable of solving the aforementioned disadvantages with good workability when the slice base is mounted on the semiconductor wafer.

OBJECTS AND ADVANTAGES OF THE INVENTION

Accordingly, it is a general object of the present invention to provide a process for forming a reinforcing material on a semiconductor wafer by using the reinforcing material as a substitute for the aforementioned slice base to improve the workability of the slicing process of a wafer with a good finish as well as to save the material cost.

It is a more specific object of the present invention to provide a process and apparatus for forming the reinforcing material, which is capable of performing a means of forming the reinforcing material at high accuracy and high workability.

It is another object of the present invention to provide a structure for mounting a slice base to a semiconductor wafer by enlarging the contact area of the interface between the slice base and the semiconductor wafer for enhancing the contact strength between them.

DETAILED DESCRIPTION OF THE INVENTION

EXAMPLE I

Figure 3:
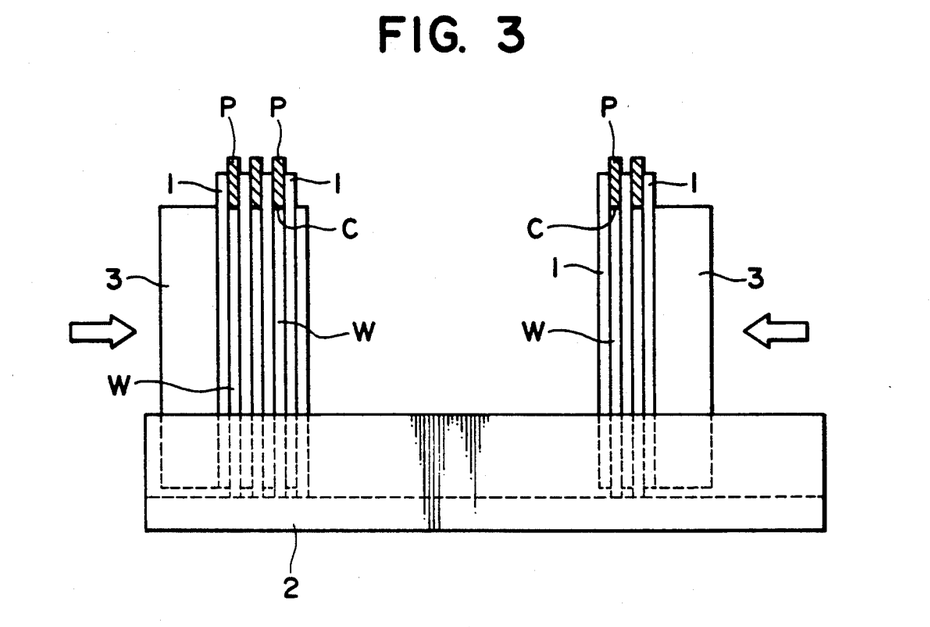
FIG. 3 is a side view for showing a method for fixing the slice base of the first example of the present invention.
Figure 4:
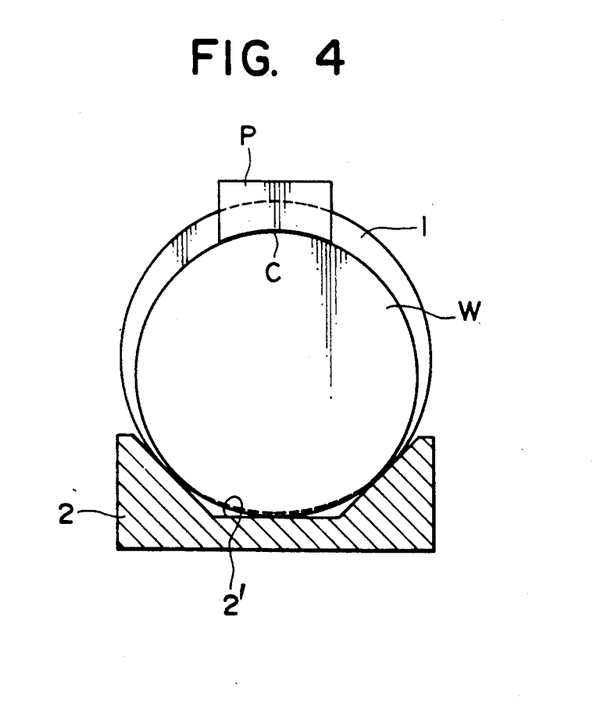
FIG. 4 is a front view of FIG. 3.
Figure 5:
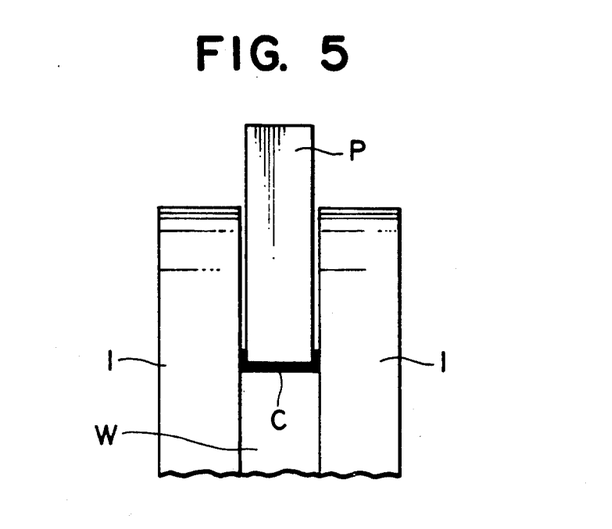
FIG. 5 is an enlarged detail of FIG. 3.

FIG. 3 to FIG. 5 show the first example of the present invention as a method for mounting a slice base to a semiconductor wafer, referring now in detail to the first example based on FIG. 3 and FIG. 4.

The first example comprises two kinds of wafers, such as a plurality of semiconductor wafer(W) and a plurality of spacing wafer(1), having a larger diameter than the semiconductor wafer. The spacing wafer(1) is only operable, to space and separate the semiconductor wafers from each other. These two kinds of wafers are aligned one by one vertically in a concave groove(2') of a wafer bed(2), so as to place two sheets of spacing wafers(1) (1) on both sides to align these wafers (W) (1) as shown in FIG. 3.

Regarding the material of these wafers(W) (1), the wafer(W) includes a single crystal silicon ingot and is formed as a disk shape sheet, and is further processed or doped in advance of re-slicing to have impurity diffusion layers on both sides of the wafer.

The material of spacing wafer(1) is made from a material which does not receive any influence from the adhesive(C); for example, it is selected from a group consisting of a tetrafluoride ethylene resin, and the spacing wafer(1) is formed so as to closely contact the semiconductor wafer(W). The material of the wafer bed(2) may be made of an adequate material, and preferably made of the same material as the spacing wafer(1), so as to not receive any influence from the adhesive(C).

In addition, pressing plates(3) (3) are provided to press the aligned wafers(W) (1) on the wafer bed(2) toward the inside from both sides, so as to hold the wafers' alignment between both pressing plates(3) (3). The material of the pressing plates(3) (3) may be made of a suitable material, and preferably made by the same material as the spacing wafer(1). To press the aligned wafers(W) (1), it is necessary to prevent these wafers(W) (1) from inclining and diverging movement of each wafer by pressing and holding these wafers in alignment as well as to reduce any gap occurring between them by contacting them as closely as possible.

Thereafter, as shown in FIGS. 3, 4 and 5, an adhesive(C) is applied thickly on the peripheral edge surfaces of the semiconductor wafers(W) which are held between both spacing wafers(1) (1) wherein a slice base(P) is inserted between both spacing wafers(1) (1) to mount the slice base(p) on the edge surface of the semiconductor wafer(W).

It is preferable to apply the adhesive(C) on the upper edge portion of the semiconductor wafer(W) and it is also possible to use the orientation flat of the semiconductor wafer(W). It is also possible to apply the adhesive(C) in advance to the slice base but not to the semiconductor wafer(W).

Regarding the material of the slice base(P), it is made of a carbon, a silicon, a quick hardening type cement or the like. As to the material of the adhesive(C), it is possible to use a thermosetting resin type adhesive such as an epoxy type resin, polyester type resin which has a good exfoliation property without losing scission property, a polyamid type resin or the like, and is also possible to use a rubber type adhesive.

According to the first example, since the spacing wafers(1) have a larger diameter than the semiconductor wafer(W), they can assist to align and restrict the semiconductor wafer(W) with the slice base(1) by pressing from both sides. The plurality of semiconductor wafers(W) with the slice base(P) can be fixed at an accurate position on the wafer bed(2) without any damage to the semiconductor wafers(W) with the slice base(P), and the shortage of fixing strength and error in the accuracy of measurement caused by the movement, incline, divergence or the like. In addition, since the combination of spacing wafers(1) put a sheet of semiconductor wafer(W) between the spacing wafers(1) on both sides, it can prevent the adhesive(C) from falling in drops along both sides of the semiconductor wafer(W) by the existence of such spacing wafers(1) closely contacting the semiconductor wafer(W), even if the adhesive(C) is overflows due to an excessive application to the edge surface of the semiconductor wafer(W). (shown in FIG. 5)

Figure 6:
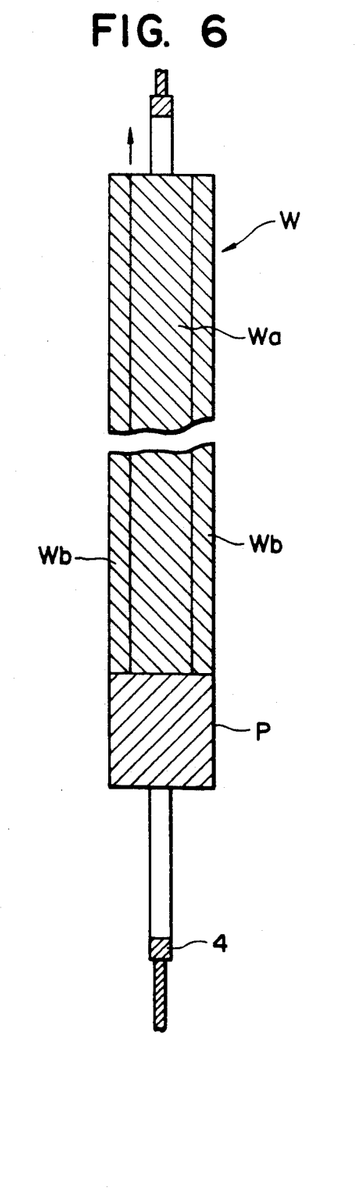
FIG. 6 and FIG. 7 are expanded sectional side views showing the process for re-slicing the semiconductor wafer into two sheets.
Figure 7:
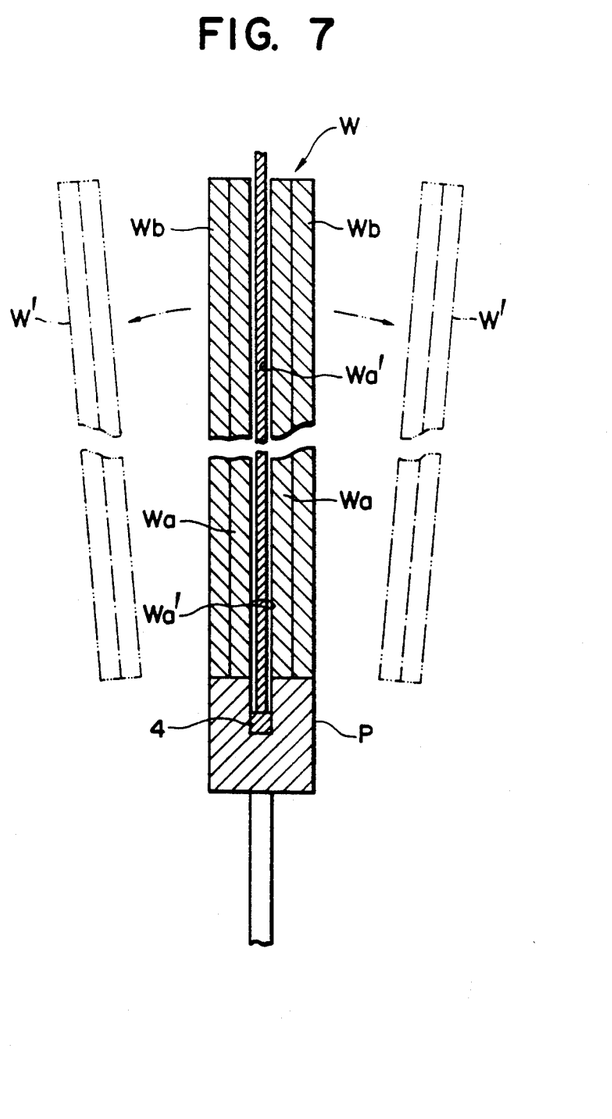

FIG. 6 and FIG. 7, refer in detail to the re-slicing process of a semiconductor wafers(W) with a respective slice base(P) aligned on the wafer bed(2) in combination with the spacing wafers(1) of the first example.

FIG. 6 it shows an enlarged semiconductor wafer(W), which includes the impurity diffusion layers(Wb) processed in advance on both sides of the wafer(W) and a plane core portion(Wa) having no impurity diffusion layer(Wb), and which is re-sliced by a slicing machine such as ID saw slicing machine, the ID saw being shown by the reference number(4) in FIG. 6. This semiconductor wafer(W) is further re-sliced by the ID saw(4) to divide it into two sheets of semiconductor wafers(W') having respective impurity diffusion layer(Wb) on one side and a plane surface(Wa') on the other side; that is, two sheets of substrates(W') (W') of discrete components can be produced simultaneously from one sheet of semiconductor wafer(W) having impurity diffusion layers(Wb) on both which are processed in advance.

This re-slicing process necessitates kerf loss of wafer material during the cutting process by the saw; however, this re-slicing process still has an advantage of the loss of material in comparison with the conventional method which the inventor referred to in his previous patent application.

In the practice of the above re-slicing process, either one of the semiconductor wafer(W) or ID saw(4) may move, and it may slice off completely throughout the wafer portion and slice base portion together or selectively slice off the wafer portion and further cut off the slice base by half so as to remain the other half base portion as shown in FIG. 7. According to this half slicing process of the slice base(P), it is effective to improve the workability of unloading the wafers(W) which are re-sliced from the slicing machine without a separation operation of two sheets of wafers(W), because of the incorporation of them at the remaining slice base(P). This re-slicing process, shown in FIG. 6 and FIG. 7, should be commonly practiced even in the subsequent example to be disclosed hereafter; however, the explanation of such the re-slicing process in FIGS. 6 and 7 will be omitted in the following example to avoid duplicate explanations.

EXAMPLE II

FIG. 8 to FIG. 11 show the second example of the present invention, which relates to a process and apparatus for mounting a slice base on a semiconductor wafer.

The second example refers to this example in accordance with the same reference numbers as in the first example, such as the semiconductor wafer(W), slice base(P) and adhesive(C), since the second example comprises materially the same members as the first example.

Figure 8:
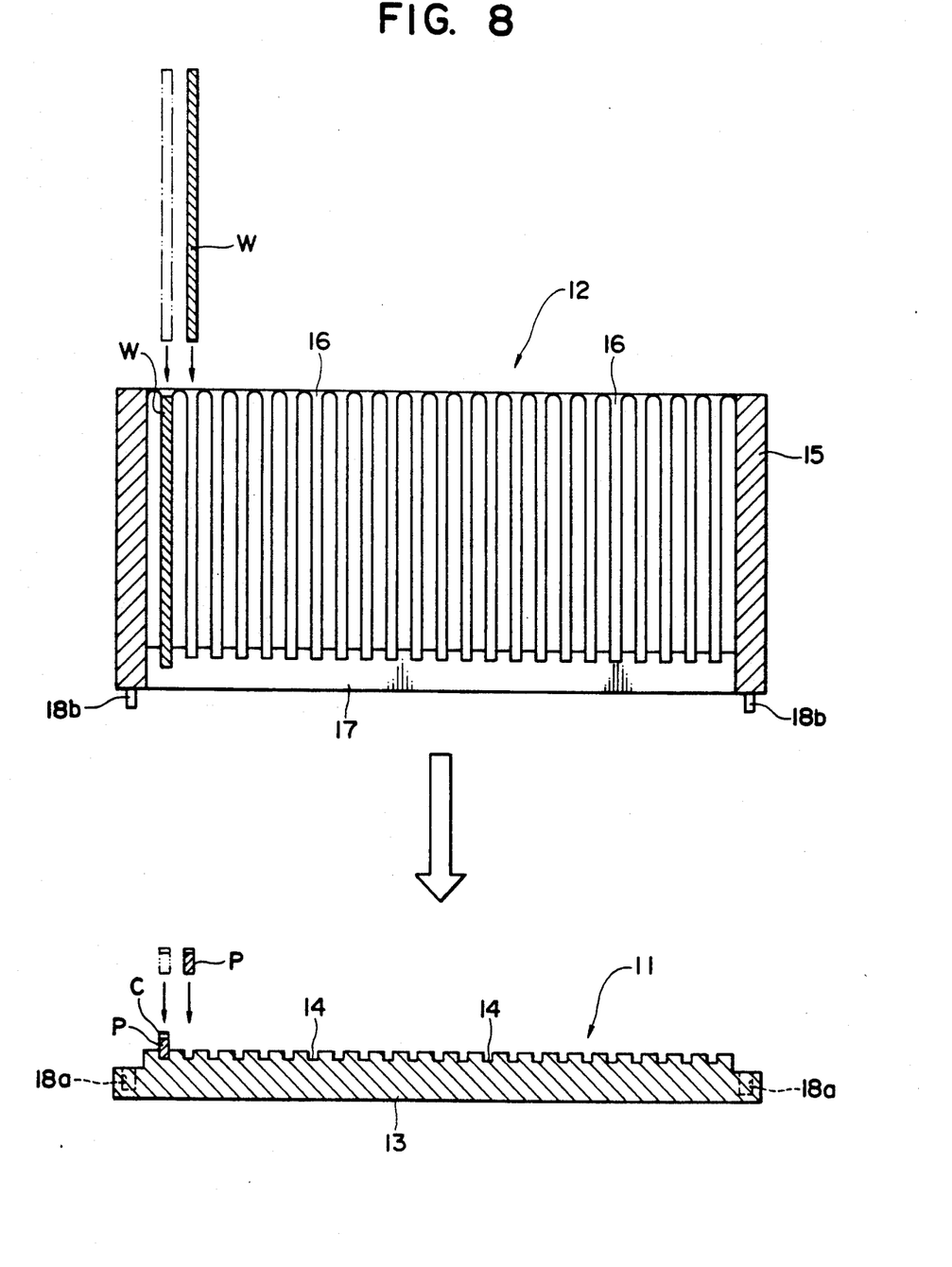
FIG. 8 is a sectional side view showing the process and apparatus for fixing the slice base on the semiconductor wafer in the second example of the present invention.

Firstly, the process for mounting a slice base in the second example is described. The major difference between the first and second examples is to use or not use a spacing wafer(1) when the slicing base(P) is applied on the peripheral edge of a semiconductor wafer(W) by using the adhesive(C). As shown in FIG. 8, the second example does not use any spacing wafer(1) at all.

Figure 9:
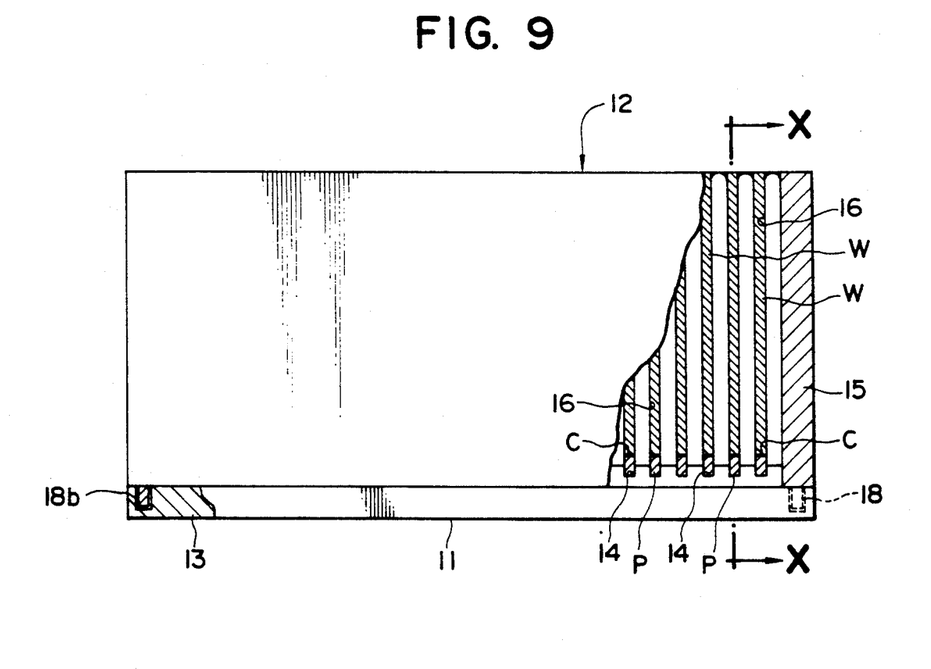
FIG. 9 is a partly broken side view for showing the state of fixing a slice base on a semiconductor wafer shown in FIG. 8.
Figure 10:
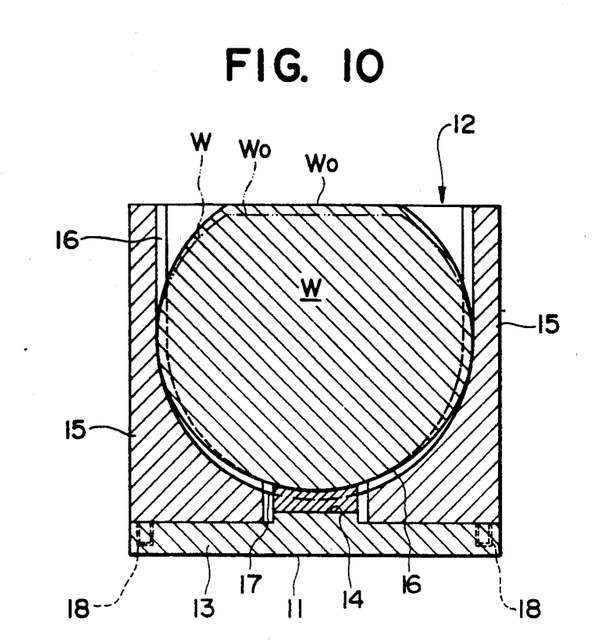
FIG. 10 is a sectional view taken along line X—X of FIG. 9.

It provides two types of rack magazines, such as a wafer rack magazine(12) and a slice base rack magazine(11) for loading the semiconductor wafer(W) and the slice base(P) into each rack groove, respectively, wherein they are correctly aligned and then the adhesive(C) is applied on the upper end of slice base(P), wherein the wafer rack magazine(12) is engaged to the slice base rack magazine(11). This feature is the outline of the process for mounting a slice base on a semiconductor wafer in the second example. In FIGS. 9 and 10, the adhesion between the bottom of semiconductor wafer(W) and the upper end of slice base(P) with the adhesive(C) is achieved by the dead weight of the wafer(W) itself, naturally without any mechanical pressure in response to the engagement between both magazines. As an option, in FIGS. 9 and 10, it may be possible to load the semiconductor wafer(W) into the wafer rack magazine(12) by making the orientation flat(Wo) portion face downwardly so as to contact the slice base(P) through the adhesive(C).

The process in the second example has the following advantages in that the semiconductor wafer(W) is mounted securely on the slice base(P) through the adhesive(C) without any movement; incline or divergence in the alignment, consequently it can prevent the semiconductor wafer(W) with the slice base(P) from any shortage of fixing strength or error in the accuracy of measurement. In addition, since the semiconductor wafer(W) is mounted on the slice base(P), it can prevent the semiconductor wafer(W) from the dirt of adhesive(C) caused by falling in drops if excessive adhesive(C) is applied on the upper end of the slice base(P).

Figure 11:
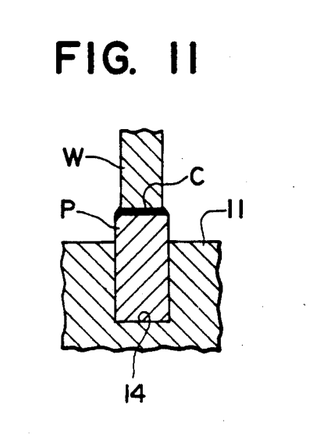
FIG. 11 is an enlarged detail of FIG. 9.

FIG. 11 shows a thicker slice base(P) having a larger core thickness than the core thickness of semiconductor wafer(W). According to this thicker slice base(P), it can prevent an adhesive(C) from over-flow to the outside if the adhesive(C) is excessively applied on the slice base(P) and in contrast it improves the fixing strength between the semiconductor wafer(W) and the slice base(P) by the excessive application of the adhesive(C).

An apparatus for mounting the semiconductor wafer(W) on the upper end of slice base(P) in accordance with the above process of the second example based on FIGS. 8 to 10 is now described.

The apparatus of the second example comprises wafer rack magazine(12) shaped as a box and a slice base rack magazine(11) shaped as a rack gear as shown in FIGS. 8 to 10. The wafer magazine body(15) of the wafer rack magazine(12) has a plurality of rack grooves(16) in both interior walls which are opposed each other in the magazine body(15). The rack grooves(16) are formed with a predetermined number and interval so as to receive a predetermined number of semiconductor wafers(W) capable of taking out and putting into the rack grooves(16) which are also formed to meet with the other rack grooves(14) of the slice base rack magazine(11). The bottom portion(17) of the wafer magazine body(15) is formed to be fully opened so as to accept the other slice base rack magazine(11)

The slice base rack magazine(11) has also a predetermined number of rack grooves(14) formed upward from the bottom portion(13) so as to meet with the above rack grooves(16) of the wafer rack magazine(12) to receive a predetermined number of slice bases(P) capable of taking out and putting into the rack grooves(14).

To secure the accuracy of engagement between both magazines(12)(11), the wafer rack magazine(12) has a plurality of guide pins(18b) projected at adequate positions on the bottom surface of the wafer magazine body(15) to engage with a plurality of guide holes(18a) bored at suitable positions(18) on the upper surface of the slice base rack magazine(11), other than at the rack grooves(14).

During the engagement of both magazines(12)(11), the predetermined number of semiconductor wafers(W) and the same number of slice bases(P) are respectively loaded into each magazine(12)(11) and these magazines(12)(11) are engaged together by engaging the guide pins(18b) with the guide holes(18a) after the application of the adhesive(C) on each upper end of slice base(P). During engagement of the both magazines(12)(11), the slice base(P) is fixed with the bottom edge of semiconductor wafer(W) so as to push up the semiconductor wafer(W) by the slice base(P) as shown in FIG. 10, and then the adhesion of both materials are achieved by the dead weight of semiconductor wafer(W) itself. Depending on the properties of adhesive(C), the hardening of adhesive(C) can be accelerated by heating the whole magazines(12)(11) containing the materials(W)(P) in a heating oven or the like. Upon completion of fixing the both materials(W)(P), they can be taken out from the upper side.

Regarding the material of making both magazines(12)(11), they may be made of an adequate material, which does not receive any adhesive influence from the adhesive(C), preferably, such as a tetrafluoride ethylene resin. In addition, an ordinal wafer magazine may be employed as a substitute for the wafer rack magazine(12).

EXAMPLE III

FIGS. 12 to 16 show the third example of the present invention which relates to an improved structure of the slice base(P) commonly used in the first and second examples as aforementioned.

Figure 12:
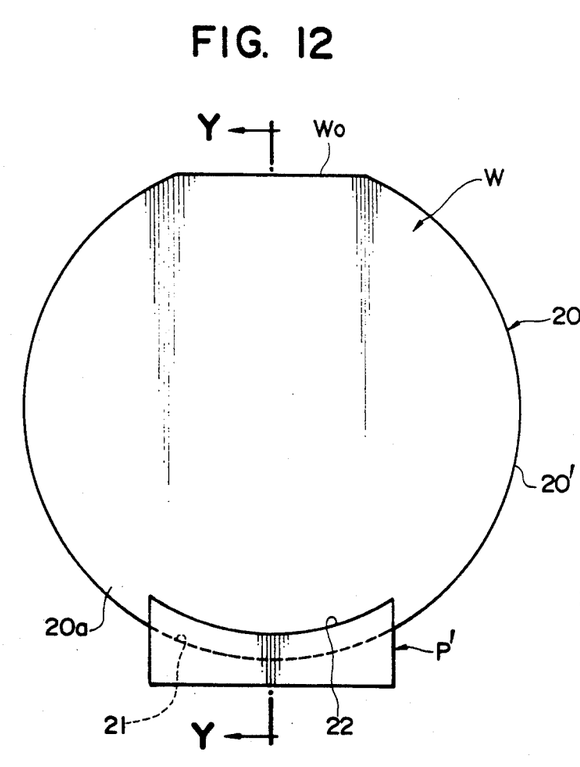
FIG. 12 is a front view showing the structure of a slice base fixed on a semiconductor wafer of the third example.
Figure 13:
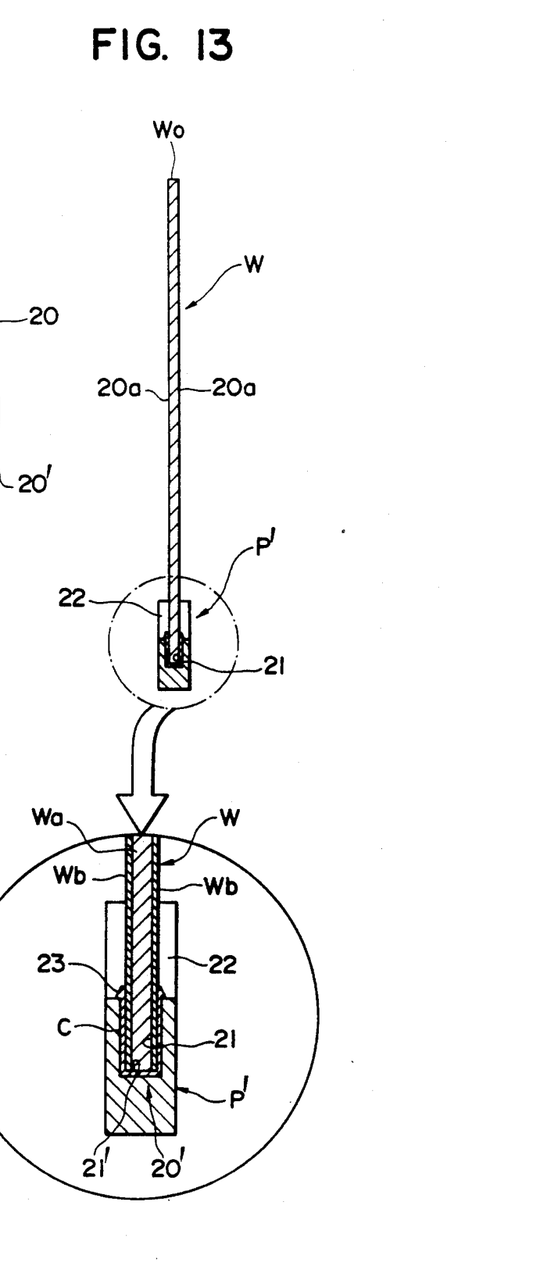
FIG. 13 is a sectional view taken along line Y—Y of FIG. 12.
Figure 14:
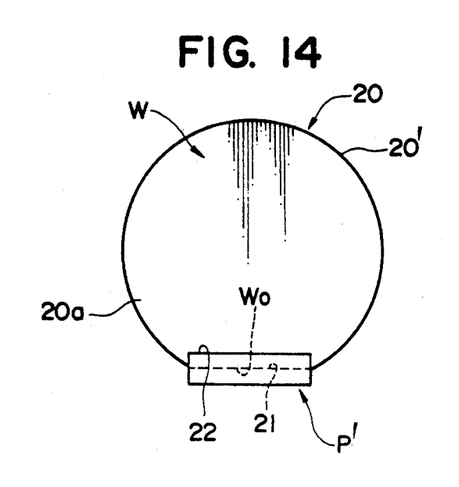
FIG. 14 is a front view showing a modified example of a fixing position of a slice base.

In the third example, which is shown in FIG. 13, a slice base(P') includes an U-shaped slit(21) in section view, which is prepared to receive a peripheral edge(20) of semiconductor wafer(W) along the upper portion(22) of the slice base(P') having the U-shaped slit(21). FIG. 12 shows a slice base(P') to be mounted on the circular arc(20') shaped peripheral edge(20) of the semiconductor wafer(W); therefore, the upper portion(22) with the U-shaped slit(21) is formed as a circular arc to meet with the circular arc shaped peripheral edge of the semiconductor wafer(W). FIG. 14 shows another slice base(P') to meet with the orientation flat(Wo) edge of the semiconductor wafer(W).

The adhesion of both materials such as the semiconductor wafer(W) and the slice base(P') is achieved in accordance with the processes for mounting the slice base(P) on the semiconductor wafer(W) disclosed in the first and second examples; that is, a comparatively thicker adhesion(C) is applied at the bottom of U-shaped slit(21) and then a semiconductor wafer(W) is inserted into the bottom of U-shaped slit(21), wherein they are fixed.

Figure 15:
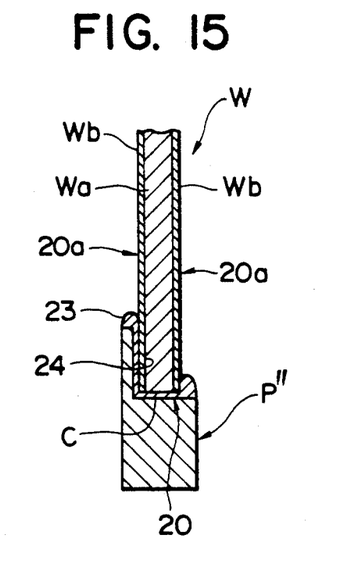
FIG. 15 is a side view in enlarged detail showing another modified example of the structure of fixing a slice base.

FIG. 15 shows a modified slice base(P") having an L-shaped step portion. In this case, it is advantageous that the workability of making such an L-shaped step type slice base(P") is comparatively easier than making the U-shaped slit type slice base(P'). Depending on the slicing method, it is sometimes required to fix two sheets of the semiconductor wafer(W) on the step portion of one piece of slice base(P"); however, the requirement can be solved easily by enlarging the width of the terrace portion of the L-shaped step type slice base(P").

Figure 16:
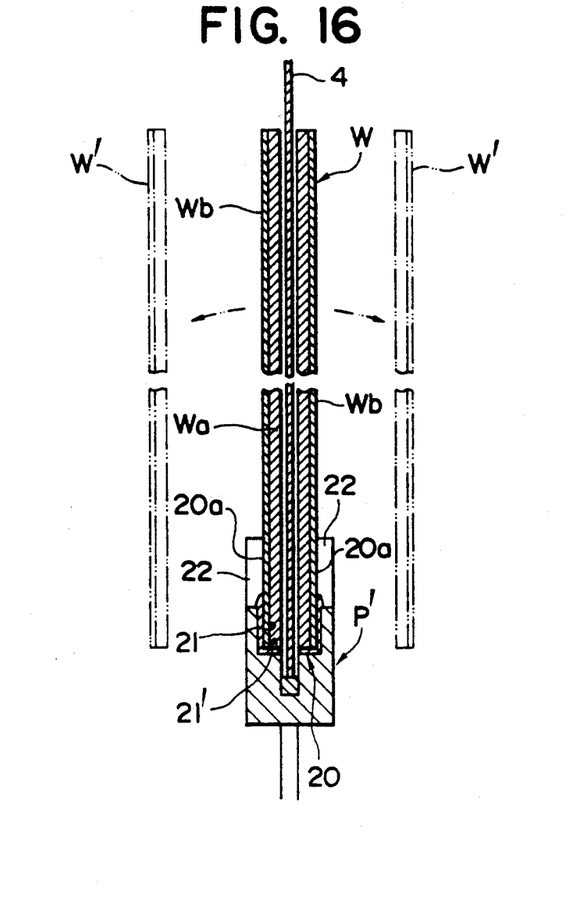
FIG. 16 is an enlarged sectional side view showing the re-slicing process of a semiconductor wafer in FIG. 13.

According to the third examples, such as the U-shaped slit type slice base(P') and the L-shaped step type slice base(P"), since the semiconductor wafer(W) is engaged closely with the interior wall surfaces(21) of the slit type slice base(P') or the one side wall surface(24) of the step type slice base(P") through the adhesive(C), the semiconductor wafer(W) can be fixed with not only the bottom(20) of the slit but also both sides(21)(21) of the interior wall surfaces(21) in FIG. 16, or not only the step(20) of the step type slice base(P"), but also one side surface(24) through the adhesive(C), wherein the fixing areas of both type slice bases(P') (P") are enlarged so as to increase their fixing strength. Further, depending on the material properties or viscosities of the adhesive(C), the adhesive(C) forms boss portions(23) which are pushed out by the pressure of insertion between the upper ends of slice bases(P') (P") and both sides of the semiconductor wafer(W), wherein the boss portions(23) are effective to further increase the fixing strength between both materials. (FIGS. 13, 15 and 16)

Thus, the semiconductor wafer(W) with the U-shaped slit type slice base(P') and/or the L-shaped step type slice base(P") is further processed to be re-sliced into two sheets of semiconductor wafer(W') having one side having a plane surface without any impurity diffusion layer and the other side with an impurity diffusion layer processed or doped in advance by using the re-slicing machine referred to in the first and second examples as shown in FIGS. 6, 7 and 16. FIG. 16 corresponds to FIG. 7 and shows a feature of slicing the slice bases(P') (P") up to the half way position of the of slice bases upon the completion of slicing the whole semiconductor wafer(W).

In one of the semiconductor wafers(W') with the U-shaped slit type slice base(P') after being re-sliced up to the half way position of slice base(P') in FIG. 16, the adhesion between the wafer(W') and the half way slit base(P') is still securely maintained along L-shaped interface between the wafer(W') and the slit base(P'). In FIG. 16, during the re-slicing process by ID saw(4) of slicing machine, the wafer(W) is going to separate by the slicing down movement of the ID saw so as to divide the wafer(W) into two sheets of wafers(W'). In addition, the core thickness of the slice base(P') is thicker than the core thickness of the wafer(W); therefore, the core portion of the U-shaped slit type slice base(P') can be held securely without any breakdown even if it is slit up to the half way position of the slice base(P').

In the re-slicing process of the L-shaped step type slice base(P") in FIG. 15, comparing the step type slice base(P") with the above slit type slice base(P'), the step type(P") would be disadvantageous because of the difference of the shape between U-shape and L-shape when they are re-sliced from their center; however, the disadvantage can be overcome if a special type chucking instrument is provided for chucking one side of the slice base(P"). (not shown in the drawing)

EXAMPLES IV AND V

The highlight of examples IV and V is to mold an adhesive(C'), which is a quick-drying type viscous liquid material, into a slice base on the upper end of the wafer(W) which is held between both spacing wafers(1), by pouring the liquid material into the space provided between both spacing wafer(1) as a substitute for those solid type slice bases(P)(P')(P"), as shown in example IV of FIGS. 17 to 20 and example V of FIGS. 21 to 30.

EXAMPLE IV

Referring now in detail to example IV, according to FIGS. 17 to 20, the practice of example IV is followed in accordance with example I in FIGS. 3 to 4; that is, it comprises two kinds of wafers such as a plurality of semiconductor wafer(W) and a plurality of spacing wafer(1) having a larger diameter than the semiconductor wafer. The spacing wafer(1) is only operable to space and separate semiconductor wafers from each other. Providing these two kinds wafers and aligning them one by one vertically in a concave groove(2') of an wafer bed(2) so as to place two sheets of spacing wafers(1)(1) on both sides of the aligned wafers(W)(1) is shown in FIG. 3.

Figure 17:
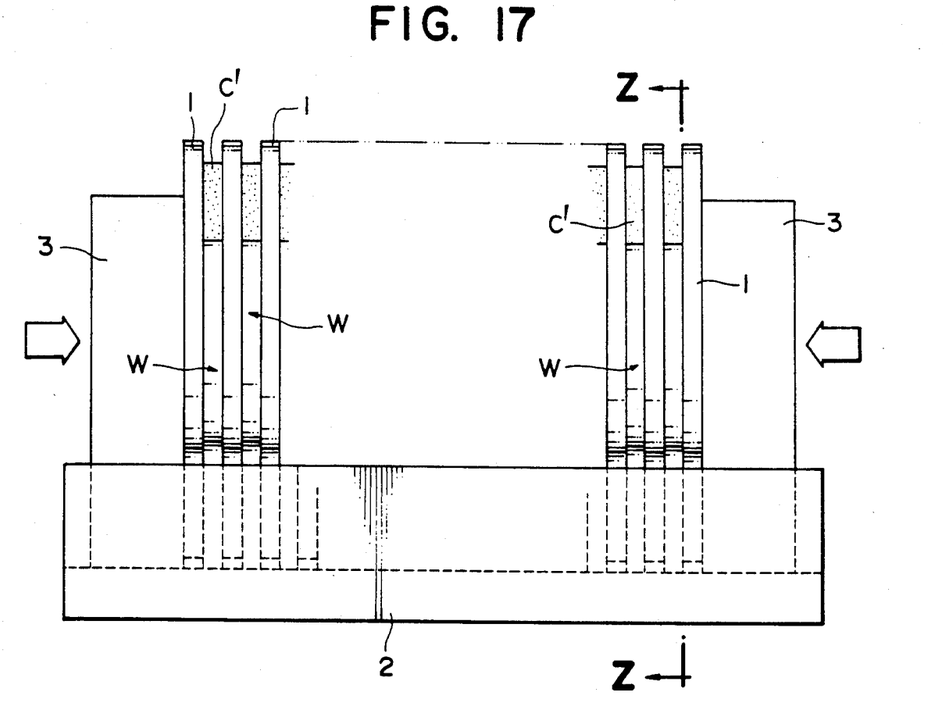
FIG. 17 is a side view showing a process for forming a slice base for a semiconductor wafer in the fourth example of the present invention.

In addition, pressing plates (3)(3) are provided to press the aligned wafers(W)(1) on the wafer bed(2) toward inside from both sides so as to hold the wafers' alignments both pressing plates(3)(3).

Figure 18:
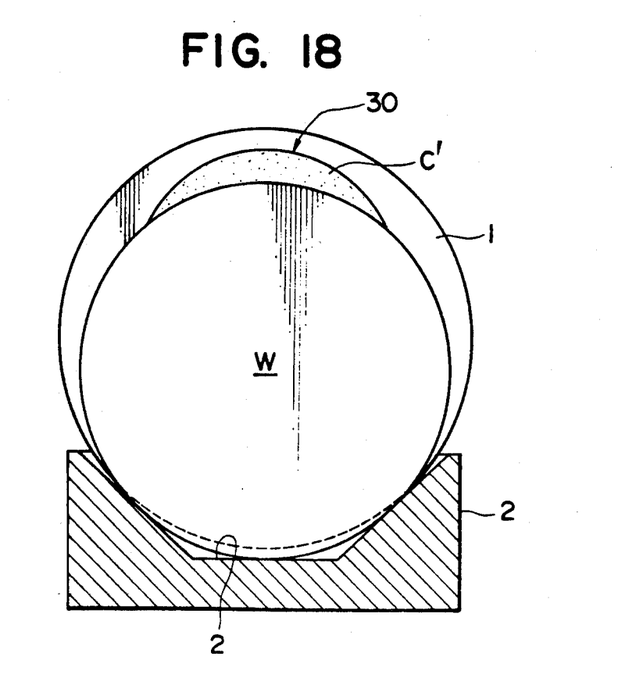
FIG. 18 is a sectional view taken along line Z—Z of FIG. 17.

Regarding the composition of the adhesive(C'), it is made of adding a filler such as talc powder, aluminum oxide powder or graphite powder with an epoxy resin type adhesive wherein they are regulated to have an adequate viscosity and adhesive property. Thus, this adhesive(C') is poured into a bottom space provided between both spacing wafers(1)(1), the bottom of space being also the peripheral edge of the semiconductor wafer(W), and the adhesive(C') is formed into a crescent shaped slice base(30) fixed on the peripheral edge of the semiconductor wafer(W), as shown in FIGS. 17 and 18 to solidify the adhesive(C'), and preferably put them into an oven so as to shorten the solidification time.

Figure 19:
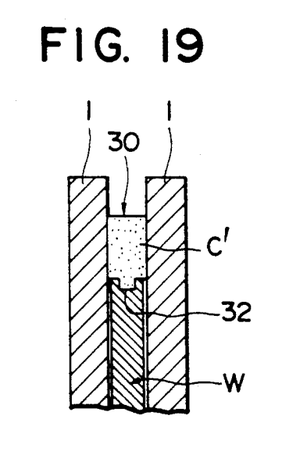
FIG. 19 and FIG. 20 are sectional views in enlarged detail for showing a modified example of a slice base, respectively.
Figure 20:
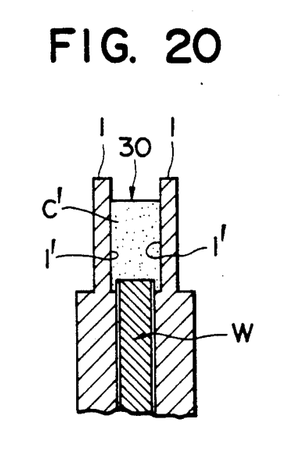

FIGS. 19 and 20 show a modified crescent shaped slice base(30) for further improving the fixing strength between the slice base(30) and the wafer(W) by processing additional modifications upon the peripheral edge of the semiconductor wafer(W) or the opposed surfaces of spacing wafers(1)(1).

In the additional modification upon the semiconductor wafer(W) in FIG. 19, a slit(32) is provided on the peripheral edge of the semiconductor wafer(W) so as to increase the interface area of mold type slice base(30) with the semiconductor wafer(W).

In the other additional modification upon the opposed surfaces of spacing wafers(1)(1) in FIG. 20, the thickness of the upper portions of spacing wafers(1)(1) are reduced to provide additional spaces between the reduced surfaces of spacing wafers(1')(1') to receive the mold type slice base(30) so as to cover the upper end of the semiconductor wafer(W) as shown in FIG. 20. The fixing strength between the mold type slice base(30) and the semiconductor wafer(W), even after the semiconductor wafer(W) being re-sliced into two sheets, the fixing strength the re-sliced mold type slice base(P) and the re-sliced semiconductor wafer(W') can be well maintained due to the sufficient thickness of the re-sliced mold type slice base(30). As an additional advantage, this process can easily widen the range of covering the lower periphery of semiconductor wafer during the last portion of re-slicing process by enlarging the size of molding type slice base, wherein this process is extremely effective for the re-slicing process of a thin type semiconductor wafer which is easily chipped off around the lower periphery portion.

The feature of FIGS. 19 and 20, as an option, can load two sheets of semiconductor wafers(W)(W) into the molding type slice base, and can re-slice them in order, depending on the preparation of a modified slicing machine having two loaders with vacuum cups opposed each other between the two sheets of semiconductor wafers(W)(W), which are capable of chucking one side to re-slice firstly and then chucking the other side to re-slice later. (not shown in the drawings)

According to this example IV of using the mold type slice base(30), since the spacing wafers(1) have a larger diameter than the semiconductor wafer(W) and can assist to align and restrict the semiconductor wafer(W) with the mold type slice base(30) formed by pouring the adhesive(C') into the space formed between both spacing wafers(1)(1), the plurality of semiconductor wafers(W) with the slice base(30) can be fixed at accurate positions on the wafer bed(2) without any damage of the semiconductor wafers(W) with the slice base(30), the shortage of fixing strength and error in the accuracy of measurement caused by the movement, incline, divergence or the like. In addition, there is no fear that a semiconductor wafer having a large size diameter and a thin thickness would be broken during pressing process from the both sides because the full surfaces of semiconductor wafers are held by spacing wafers, and also no fear that the adhesive(C') is falls out in drops along the surfaces of semiconductor wafers(W) because they are closely contacted by the spacing wafers on both sides by pressure. In addition, since the adhesive(C') can be easily filled to cover the peripheral edge of semiconductor wafer(W) over the wide area of interface by utilizing the flowability of the adhesive(C'), no loss of the crude material of slice base(P)(P')(P'') is produced during the cutting process of the crude material into each piece of the slice base, whereby it can save the material cost in the example IV.

EXAMPLE V

FIGS. 21 to 30 show example V of a process and apparatus for forming another mold type slice base(40). Referring now to the apparatus for forming the mold type slice base(40), this apparatus comprises a wafer magazine($A_1$) to hold a plurality of semiconductor wafer(W) aligned in an upright position and a mold bed-($A_2$) having a plurality of molding grooves(45) to form slice bases(40) from the adhesive(C'). This mold bed-($A_2$) is purposed to receive the bottom of wafer magazine($A_1$). The wafer magazine($A_1$) is made of a resin, which has a specified property of not receiving adhesive influence from the adhesive(C'), such as a resin selected from the group consisting of a tetrafluoride ethylene resin. The wafer magazine($A_1$) is formed as a box body(41) having a plurality of guide slits(42) opposedly provided in both side interior walls of the body wall(41a) to receive the plurality of semiconductor wafers(W) by inserting the wafers(W) vertically along the guide slits(42).

Figure 21:
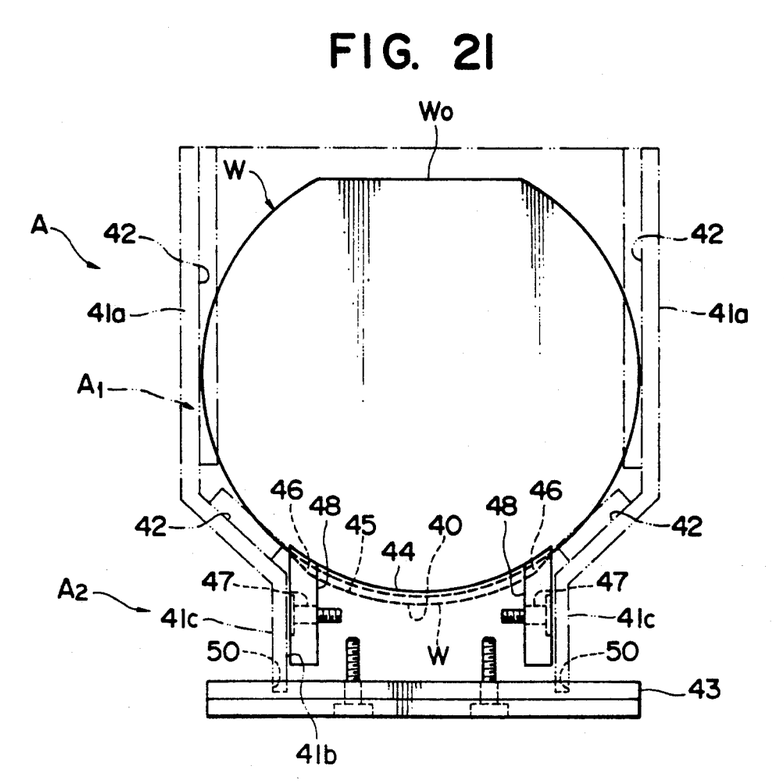
FIG. 21 is a front view for showing a state of inserting an wafer into an apparatus for forming a slice base of a semiconductor wafer relating the fifth example.

The body walls(41a) of the box body(41) are made to dogleg inwardly toward each other with the same guide slits(42), the body walls(41a) extend from the leg portions(41C)(41C) which form a bottom opening((41b) along the longitudinal direction of the box body(41) to engage with the mold bed($A_2$) so as to cover the box body(41) of the wafer magazine($A_1$) on the mold bed-($A_2$).

Figure 22:
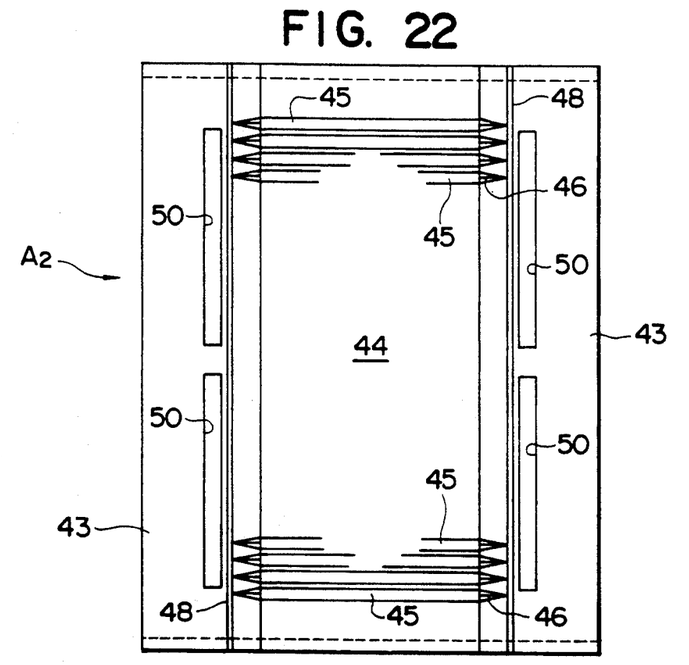
FIG. 22 is a plan view showing a molding groove of the apparatus in FIG. 21.

The mold bed($A_2$) provides a mold portion(44) with molding grooves(45) on the base plate(43) of the mold bed($A_2$) for receiving the bottom edge of the semiconductor wafer(W) on the upper surface of the mold bed-($A_2$). The molding grooves(45) of the mold bed($A_2$) are made in the same shape and pitch as the other guide slits(42) of the wafer magazine($A_1$) so as to receive the semiconductor wafer(W) when the wafer magazine($A_1$) and the mold bed($A_2$) are engaged together. The base plate(43) of the mold bed($A_2$) has grooves for engagement(50) in both sides of the base plate(43) to engage with the lower ends of the legs portions(41C) of the wafer magazine($A_1$).

Regarding the formation of the mold portion(44) with the molding grooves(45), the mold portion(44) is formed as a concave circular arc so as to almost meet with or be in excess of the circle of the semiconductor wafer(W) and the molding grooves(45) are formed as a circular arc along the concave circular arc of the mold portion(44) to be receive the adhesive for forming the mold type slice bases(40) to fixed with the bottom edge of the semiconductor wafer(W).

Figure 26:
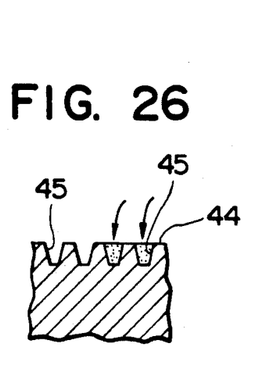
FIG. 26 is a sectional view of a molding groove.
Figure 29:
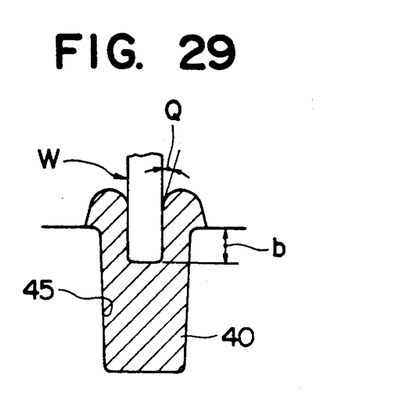
FIG. 29 is a vertical section showing a state of forming a slice base in a molding groove.

In FIG. 26 and FIG. 29, the shape of the molding grooves(45) may be formed as an enlarged trapezoidal shape capable of covering the lower end of the semiconductor wafer(W) by the adhesive(C').

Figure 27:
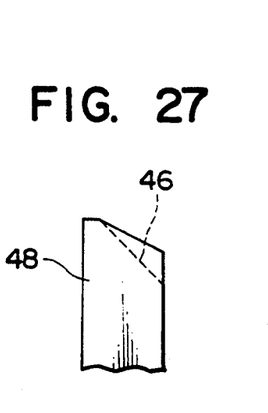
FIG. 27 is a side view showing the V-shaped guide slit in the apparatus of FIG. 21.
Figure 28:
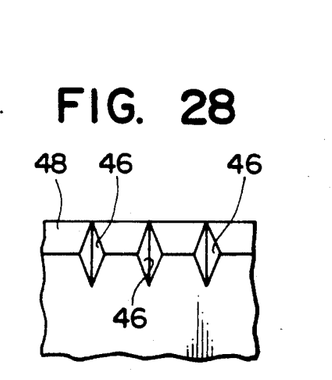
FIG. 28 is a front view showing the V-shaped guide slit.

In addition, both ends of the molding grooves(45) provide V-shaped guide slits(46) for supporting the peripheral edge of the semiconductor wafer(W) from the lower portion. As shown in FIGS. 27 and 28, the V-shaped guide slits(46) are formed so as to deepen the V-shape slit inwardly from the outside, and are formed along the circular arc of the molding grooves(45) of the mold portion(44) on plate members(48) which are fixed by screws with both sides of the mold portion(44). The center line of the V-shaped guide slits(46) is made to meet with the center line of the molding grooves(45);

therefore, each semiconductor wafer(W) is positioned at the center lines by engaging the wafer magazine($A_1$) with the mold bed($A_2$). The molding grooves(45) form the mold type slice bases(40) along the peripheral edge of the semiconductor wafer(W) by pouring and to solidify the adhesive(C') into the molding grooves(45); therefore, the mold type slice bases(40) can be formed with high accuracy along the peripheral portion of the semiconductor wafer(W) by supporting the peripheral edge portion of the semiconductor wafer(W) at the center line of the V-shaped guide slits(46).

In addition, the plate members(48) to be fixed with the both sides of the mold portion to be adjustable up and down by loosening the screws(47), wherein it is possible to adjust the inserting depth of the lower peripheral edge of semiconductor wafer(W) into the molding grooves(45) by adjusting the plate members(48) up and down so that it is then possible to vary the inserting depth of the semiconductor wafer(W) to the mold type slice base(40).

Figure 23:
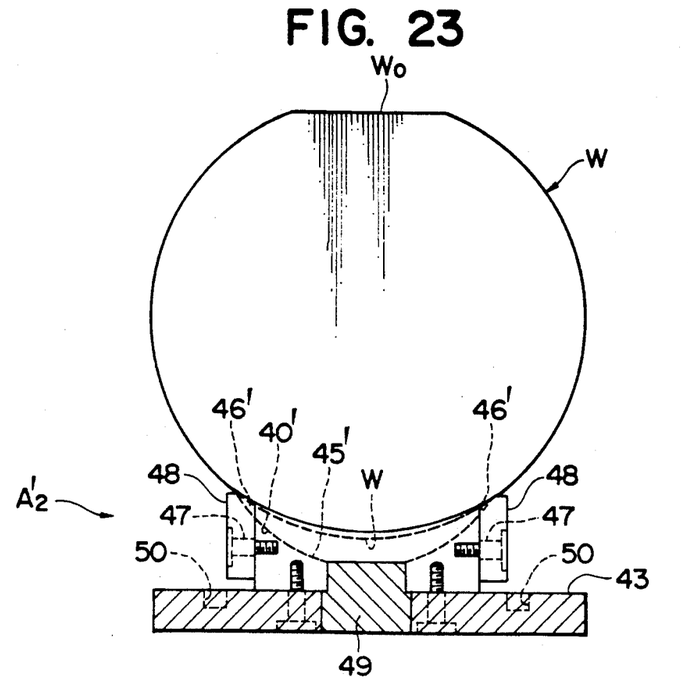
FIG. 23 is a front view for showing a molding groove deeply formed in the center portion of a groove.
Figure 24:
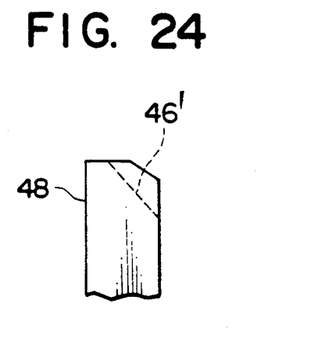
FIG. 24 is a side view showing a V-shaped guide slit of the apparatus.
Figure 25:
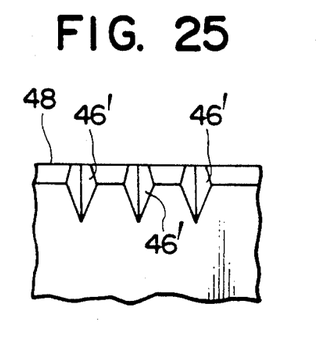
FIG. 25 is a front view showing the V-shaped guide slit of FIG. 24.

FIG. 23 shows another example of the mold portion of the mold bed($A_2$). In FIG. 23, molding grooves(45') are formed deeper downwardly with a smaller circular arc than the wafer's circular arc, wherein the mold type slice base(40') is formed as a slice base having a deeper depth at the central portion. Both sides of the molding grooves(45') provide V-shaped guide slits(46') as shown in FIGS. 24 and 25. By forming the slice base(40') with the wide depth at the central portion to fix with the semiconductor wafer(W), the slice base(40') can still hold two sheets of a re-sliced semiconductor wafer(W')(W') on the slice base(40') upon the completion of re-slicing process of the wafer(W); therefore, it is advantageous that it can unload the re-sliced wafers(W')(W') at the same time upon the completion of the re-slicing process. This type mold bed($A_2$) is, therefore, suitable for such an unloading method without separation of two sheets.

The above type mold bed($A_2$) provides an insert core(49) separated from the base plate(43) so as to close the other opening portion located under the molding grooves(45'). This insert core(49) is operable to take out from the base plate(43) upon the completion of molding process of the slice base(40'). After the taking out the insert core(49), the semiconductor wafer(W) with the mold type slice base(40') is unloaded by pushing up from the bottom portion through the opening of the base plate(43). By pushing up the slice base(40'), the semiconductor wafer(W) is unloaded from the wafer magazine($A_2$) without causing any damage to the wafer's surfaces(W). In addition, both sides of the molding grooves(45') provide V-shaped guide slits(46') formed as extending the circular arc of the molding grooves(45') as shown in FIGS. 24 and 25.

The method for forming the mold type slice base(40') in the example V by using the aforementioned apparatus(A) for forming the slice base(40') is now described.

In the method, plurality of the semiconductor wafers(W) are loaded into the wafer magazine($A_1$) in the same pitch with each other along the guide slits(42) as the orientation flat(Wo) of the semiconductor wafer(W) being positioned in the upper state. In this state, the lower peripheral edges of the semiconductor wafers(W) are inserted along the guide slits(42) on both sides of the wafer magazine($A_1$) and then the semiconductor wafers(W) are held vertically without any backlash in the wafer magazine($A_1$) by holding both side peripheral edges of the semiconductor wafer(W) in both side interior walls(41a).

A hardening type resin as a crude material to form the slice base(40) is filled into each molding groove(45') of the mold bed($A_2$) to be inserted into the bottom opening(41b) of the wafer magazine($A_1$). The hardening type resin is selected from the group consisting of an epoxy resin mixture such as a thermosetting resin mixed with talc powder, aluminum oxide powder or graphite powder as a filler for providing a certain viscosity of not flowing out when filled in the molding grooves(45'), wherein the hardening type resin is filled to the upper limit of each molding groove(45') while drawing attention to not insert any air bubble into the molding resin by using an instrument for filling the resin. (FIG. 26)

The wafer magazine($A_1$) and the molding bed($A_2$) are engaged so as to cover the opening portion(41b) of the wafer magazine($A_1$) on the molding portion(44) of the molding bed($A_2$) to insert the lower ends of the legs portions(41c) of the wafer magazine($A_1$) into the receiving grooves(50), wherein the lower peripheral edges of the semiconductor wafer(W) are inserted into the molding grooves(45') of the molding bed($A_2$) by the dead weight of the wafer itself or suitable pressurization from the upper side. (FIG. 21)

In the above case, the lower peripheral edge of the semiconductor wafer(W) is inserted into V-shaped guide slits(46) of the both side of the molding grooves(45'), and supported from the lower portion, wherein the lower peripheral edge of the semiconductor wafer(W) is positioned at the central line of the molding grooves(45') and then covered by the adhesive(C') which is filled into the molding grooves(45') with a predetermined depth(b). When the lower peripheral edge of the semiconductor wafer(W) is inserted into the adhesive resin filled in the molding grooves(45'), the resin rises at both sides of the wafer(W) and the raised portions are formed with the acute angle (Q) causing by the sufficient viscosity and the surface tension as shown in FIG. 29, and then the raised portions are kept as they are.

The inserting depth of the lower peripheral edge of the semiconductor wafer(W) into the molding grooves(45') can be adjustable by moving the plate member(48) up and down. The molding adhesive filled into the molding grooves(45') together with the lower peripheral edge of the semiconductor wafer(W) is thermally solidified in an environment having a predetermined temperature. After the solidification, the wafer(W) with the solidified slice base(40) is unloaded from the wafer magazine($A_1$) by separating the wafer magazine from the molding bed($A_2$). In addition, the exfoliation of the slice base(40) from the molding grooves(45') can be achieved easily by using a high exfoliation type resin, however, it may be further useful to employ an exfoliating agent to coat the interior surfaces of the molding grooves(45') in advance. The slice base(40) made of the resin and formed around the peripheral edges of the semiconductor wafer(W) is formed so as to cover both surfaces of the peripheral edges of the semiconductor wafer(W) as shown in FIG. 29. The semiconductor wafer(W) unloaded from the molding bed($A_2$) is further transferred to the cutting process for dividing the unloaded wafer(W) into two sheets, and the wafer magazine($A_1$) and the molding bed($A_2$) are repeatedly used.

According to the aforementioned process for forming the slice base, it can mold the slice base(40) to incorporate with the lower peripheral edge of the semiconductor wafer(W) without making by hand as the wafers(W) are loaded within the magazine(A₁). Therefore, it can form the slice base(40) with high accuracy by saving manual labor as well as can reduce the flow out of the adhesive which has occurred conventionally and further reduce the damage during the handling of the wafer(W). In addition, it can save the material cost since such a ready made type slice base is comparatively expensive but this invention does not employ such an expensive type slice base.

In the re-slicing process, the above semiconductor wafer(W) with the slice base(40) is re-sliced into two sheets from the center portion of the core thickness of the wafer(W) by using an ID saw or the like, however, it can prevent the wafer(W) effectively from the damage for the end portion of the wafer(W) caused by the cutting pressure by the squeezing of the saw into the core since the lower peripheral edge of the semiconductor wafer(W) is reinforced so as to cover the lower end by the slice base(40) as shown in FIG. 29.

Upon the completion of the re-slicing process, a mold-releasing agent is impregnated into the joint portion between the lower end of the wafer(W) and the mold type slice base(40) for removing the slice base(40) which is already unnecessary from the lower end of the wafers(W) which has been re-sliced into two sheets. In the impregnation of the mold-releasing agent into the joint portion, the mold-releasing agent is easily impregnated into the joint portion since the joint portions are formed with the acute angle(Q) degree causing by the sufficient viscosity and the surface tension as shown in FIG. 29, in addition it is advantageous that it can remove the slice base(40) easily from the lower end of the wafer(W) since the mold type slice base(40) is pressed by external force under favorable conditions as a force to allow the wafer to be released from the slice base(40).

In the re-slicing process of the wafer(W), the wafer(W) is re-sliced by the ID saw while the wafer(W) is held by a vacuum chuck equipped with the slicing machine after being loaded on the vacuum chuck by a loader(i.e. an wafer loading manipulator having a vacuum cup on the end of manipulator). In the loading or unloading operation of the wafer(W), it appears disadvantageous that the vacuum chuck or cup would be unable to chuck the whole surface of the wafer(W) because of the structure of the mold type slice base(40) formed with one step projecting outwardly from the wafer surface, however, it is proven that there is no problem to chuck the wafer portion other than the projecting portion of the slice base(40).

Figure 30:
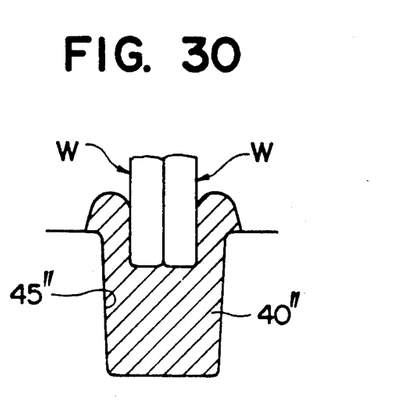
FIG. 30 is a vertical section showing a state of forming a slice base fixed on two sheets of a semiconductor wafer.

According to the above process for forming the mold type slice base, as shown in FIG. 30, it can form a slice base(40'') for covering the lower peripheral edges of two sheets or more than two sheets of the semiconductor wafer(W).

In addition, there are two method to completely re-slice the wafer(W) together with the slice base(40) into two sheets, and/or to re-slice the wafer(W) with half of slice base(40) to remain with the last part of the slice base(40) to hold the re-sliced two sheets of the slice base(40) wherein it can unload the two sheets of the wafer(W')(W'). In the former method, the slice base is formed with the same width as the slice base(40) formed in the molding grooves(45) of the molding bed(A₂), and in the latter method, it can correspond by enlarging the width of the central portion to be sliced such as the slice base(40') formed in the molding grooves(45') of the molding bed(A₂). In case of enlarging the reinforcing range of the slice base(40), or in case of forming the slice base(40) along the orientation flat(Wo) of the semiconductor wafer(W), it can correspond by changing the form of the molding grooves of the molding bed.

Regarding the wafer magazine(A₁), a general type article on the market is adaptable, however, it is suggested to use a specially designed wafer magazine in case of forming a slice base with a wide range such as to form two sheets of the wafer(W) at the same time, or to form a slice base for a specially thickened wafer, or specially thickened peripheral edge portion.

According to the apparatus referred to in example V, a plurality of semiconductor wafers are aligned to vertically hold in an wafer magazine, the lower peripheral edges of these wafer being inserted into molding grooves having a concave circular arc shape of a molding bed respectively. The lower peripheral edges of the wafer are supported on V-shape guide slits provided on both ends of the molding grooves so as to position at the central line of the molding grooves, it can form slicing bases made of hardening type resin to fix with the plurality of semiconductor wafers at the same time so as to cover the lower peripheral edges of the wafer with an equal thickness of the core of the slice base in both sides.

In addition, it can vary the depth of molding the lower ends of the semiconductor wafer into the mold type slice base by adjusting the molding depth the lower end of the wafer into the molding grooves by composing the supporting member of the molding grooves having the concave circular arc shape in both sides with the other member.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A process for mounting and simultaneously molding a slice base on the lower peripheral edge of a semiconductor wafer, comprising the steps of:

providing a plurality of semiconductor wafers having impurity diffusion layers on both sides of said wafers, said wafers also having a plane core portion without an impurity diffusion layer therein, providing a wafer rack magazine having a rectangular opening at its bottom, loading said semiconductor wafers in said wafer rack magazine, such that the lower peripheral edge portion of said semiconductor wafers are exposed from said rectangular opening of said wafer rack magazine;

providing a slice base molding bed having molding grooves in its upper surface;

providing a thermosetting adhesive having a desirous viscosity;

pouring an amount of said adhesive respectively into said molding grooves of said slice base molding bed;

placing said wafer rack magazine loaded with said semiconductor wafers therein on said slice base molding bed which was poured with said adhesive into said molding grooves so as to insert said lower peripheral edges of said semiconductor wafers exposed in said rectangular opening with a predetermined depth in the adhesive core for mounting and simultaneously molding the slice bases on the semiconductor wafers; and allowing said thermosetting adhesive to set in said molding grooves;

unloading said semiconductor wafers incorporated with said molded slice bases at the same time from said wafer rack magazine, when said wafer rack magazine is engaged with said slice base molding bed upon the substantial completion of the thermosetting process of said adhesive within said molding grooves of said slice base molding bed.

2. The process according to claim 1, wherein said thermosetting adhesive is an epoxy type resin and wherein said desirous viscosity is obtained by mixing talc into said resin.

3. The process according to claim 1, wherein said mold type slice base is molded so as to adhere to the lower peripheral edge of said semiconductor wafer, and so as to cover both sides of the lower portion of said semiconductor wafer.

4. The process according to claim 3, wherein said mold type slice base is molded and formed as a crescent shape on the lower peripheral edge of said semiconductor wafer.

5. The process according to claim 3, wherein said molded type slice base is mold and formed around the lower peripheral edges of two or more sheets of said semiconductor wafers.

6. An apparatus for mounting and simultaneously molding a slice base on the peripheral edge of semiconductor wafers, comprising:

a wafer rack magazine having two sides and a plurality of guide racks formed in opposed interior walls of both sides of said magazine for loading or vertically unloading a plurality of semiconductor wafers into or from said guide racks in said magazine;

a rectangular opening provided at the bottom portion of said wafer rack magazine so as to expose the lower peripheral edges of said semiconductor wafers when loaded vertically into the magazine;

a slice base molding bed having a plurality of molding grooves formed as a concave crescent shape on the upper surface of said slice base molding bed for receiving an adhesive into each molding groove to mold and mount molded type slice bases so as to cover the lower peripheral edge portion of each of said semiconductor wafers; and V-shaped guide slits provided at respective ends of said crescent shaped molding grooves, said V-shaped guide slits being formed on the upper surface of said molding bed for receiving a lower peripheral edge of a semiconductor wafer when it has been vertically loaded in order to accurately position the lower edge of the semiconductor wafer along the center line of said molding grooves which are filled by the adhesive material.

7. The apparatus according to claim 6, wherein said V-shaped guide slits portions are provided separately to attach with both ends of said crescent shaped molding grooves on the molding bed, said V-shaped slits comprising adjustable means to adjust the level of said V-shaped slits so as to adjust the depth of insertion of the lower edge of said semiconductor wafer into the adhesive within the molding groove.

* * * * *